(12) United States Patent
Rende

(10) Patent No.: US 11,349,250 B2
(45) Date of Patent: May 31, 2022

(54) RECESSED ELECTRICAL USER

(71) Applicant: ITALY INNOVAZIONI S.P.A., Milan (IT)

(72) Inventor: Giorgio Rende, Corigliano Calabro (IT)

(73) Assignee: ITALY INNOVAZIONI S.P.A., Milan (IT)

( * ) Notice: Subject to any disclaimer, the term of this patent is extended or adjusted under 35 U.S.C. 154(b) by 0 days.

(21) Appl. No.: 17/053,660

(22) PCT Filed: Apr. 24, 2019

(86) PCT No.: PCT/IB2019/053361
§ 371 (c)(1),
(2) Date: Nov. 6, 2020

(87) PCT Pub. No.: WO2019/220238
PCT Pub. Date: Nov. 21, 2019

(65) Prior Publication Data
US 2021/0242622 A1  Aug. 5, 2021

(30) Foreign Application Priority Data

May 15, 2018 (IT) .................. 102018000005397

(51) Int. Cl.
*H01R 13/74* (2006.01)
*H01R 13/52* (2006.01)
*H01R 13/66* (2006.01)
*H05K 5/03* (2006.01)
*H02J 7/02* (2016.01)

(52) U.S. Cl.
CPC ..... *H01R 13/5213* (2013.01); *H01R 13/6675* (2013.01); *H01R 13/74* (2013.01); *H05K 5/03* (2013.01); *H02J 7/02* (2013.01)

(58) Field of Classification Search
CPC ............ H01R 13/5213; H01R 13/6675; H01R 13/74; H01R 13/447; H05K 5/03; H02J 7/02
See application file for complete search history.

(56) References Cited

U.S. PATENT DOCUMENTS 5,495,402 A * 2/1996 Houssian ................ F21S 8/035
362/186
6,457,843 B1 * 10/2002 Kester ................ F21V 33/0076
362/186

(Continued)

FOREIGN PATENT DOCUMENTS

CH        701228 A1     12/2010
CN       104409932      3/2015
(Continued)

*Primary Examiner* — Tho D Ta
(74) *Attorney, Agent, or Firm* — Pearne & Gordon LLP

(57) ABSTRACT

An electrical user comprising: —a recessed frame (2); —a cover (3) of said frame comprising an electrical device (31); —an electric power/data transmission socket (4) applied to said frame (2), the socket (4) being concealed. The cover (3) is movable at least between an open configuration and a closed configuration; in said closed configuration a housing (30) is identified between the socket (4) and the cover (3); in said closed configuration said housing (30) is suitable for housing an electric plug connected to the socket (4).

11 Claims, 5 Drawing Sheets

(56) References Cited

U.S. PATENT DOCUMENTS

| | | | | |
|---|---|---|---|---|
| 2008/0236887 A1* | 10/2008 | Bakst | ................... | H01R 13/447 |
| | | | | 174/563 |
| 2017/0356638 A1* | 12/2017 | Mousavi | ............... | F21V 17/107 |
| 2018/0032041 A1 | 2/2018 | Barbosa Sirgado | | |
| 2021/0083462 A1* | 3/2021 | Rende | ..................... | H02G 3/12 |

FOREIGN PATENT DOCUMENTS

| | | | |
|---|---|---|---|
| CN | 105048232 | | 11/2015 |
| CN | 204835100 | | 12/2015 |
| CN | 204858086 | | 12/2015 |
| CN | 204858688 | | 12/2015 |
| EP | 3258326 | | 12/2017 |
| EP | 2863483 | B1 | 8/2019 |
| KR | 20170027156 | A * | 3/2017 |

\* cited by examiner

RECESSED ELECTRICAL USER

TECHNICAL FIELD

The present invention relates to a recessed electrical user.

PRIOR ART

Recessed electrical sockets are known. They comprise an electrical box recessed in a support, typically a wall. The electrical box is occluded at the front by a frame in which an electrical socket is formed. A cover is laterally slidable along the frame between a position in which it prevents a user's hands from physically accessing the electrical socket and a position in which it allows a user to insert and remove an electrical plug from the socket.

Electronic devices that allow domotic control are also known. They comprise recessed wall displays that define a user interface through which the user can interact with domestic applications.

OBJECT OF THE INVENTION

The object of the present invention is to propose an electrical user which allows the utmost flexibility of use. A further object of the present invention is to optimise the structure of a recessed electrical user to facilitate the installation of domotic and similar controls.

The stated technical task and specified objects are substantially achieved by an electrical user comprising the technical features set forth in one or more of the appended claims.

BRIEF DESCRIPTION OF THE DRAWINGS

Further characteristics and advantages of the present invention will become more apparent from the following indicative and therefore non-limiting description of an electrical user as illustrated in the appended drawings, in which.

DETAILED DESCRIPTION OF PREFERRED EMBODIMENTS OF THE INVENTION

Figure 1:
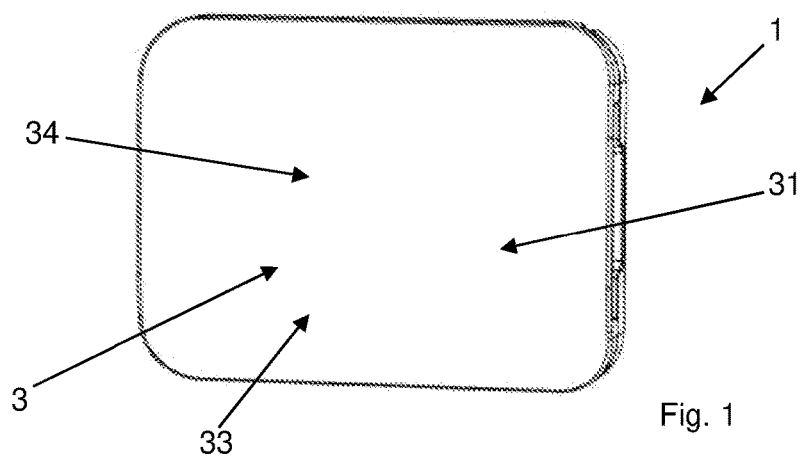
FIGS. 1 and 2 show a perspective view of two different configurations of an electrical user according to the present invention.
Figure 2:
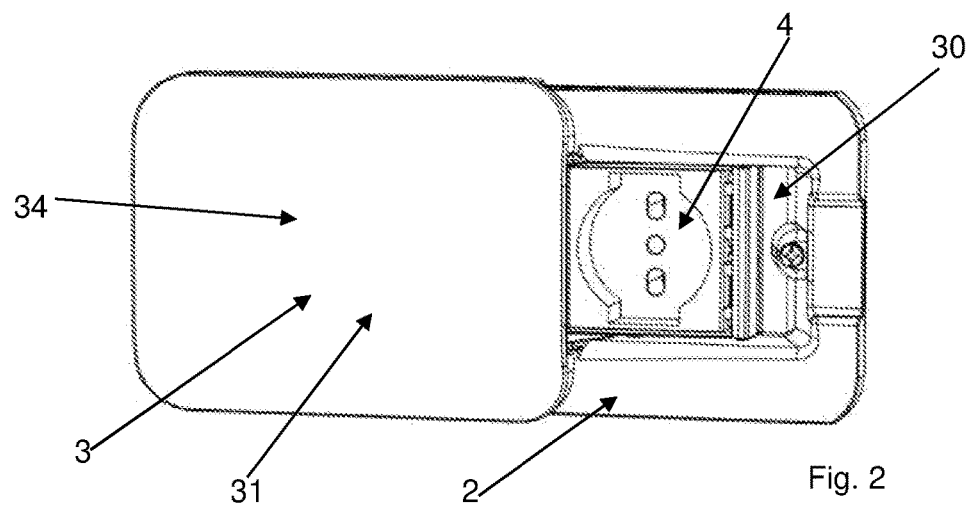

In the appended figures, reference number 1 indicates an electrical user comprising:
- a frame 2;
- a cover 3 for covering the frame 2;
- at least one electric power/data transmission socket 4 applied to the frame 2, this socket 4 being concealed. The socket 4 is an electrical receptacle. It could also be a USB socket, HDMI socket, coaxial antenna cable, etc. The socket 4 is connected to the electricity mains. Advantageously, the socket 4 can be assembled to the frame 2; in an alternative configuration it could be at least partly integrated in a single body in the frame 2.

Suitably the electrical user 1 comprises a recessed electrical box 7 (typically in a wall or in a portion of wall). The frame 2 is applicable to (or better engageable in) the electrical box 7. The frame 2 occludes an opening of the electrical box 7. The box 7 is connected to the electricity mains.

The socket 4 is at least partially recessed in the electrical box 7.

Figure 3:
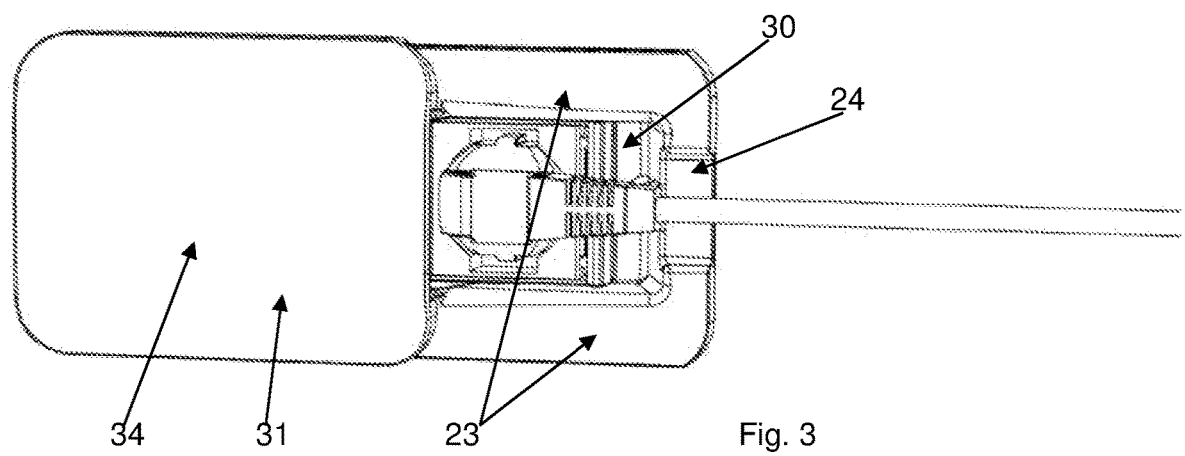
FIGS. 3, 4, 5 show a perspective view of different configurations of an electrical user according to the present invention to which an electrical plug of an appliance is applied.
Figure 4:
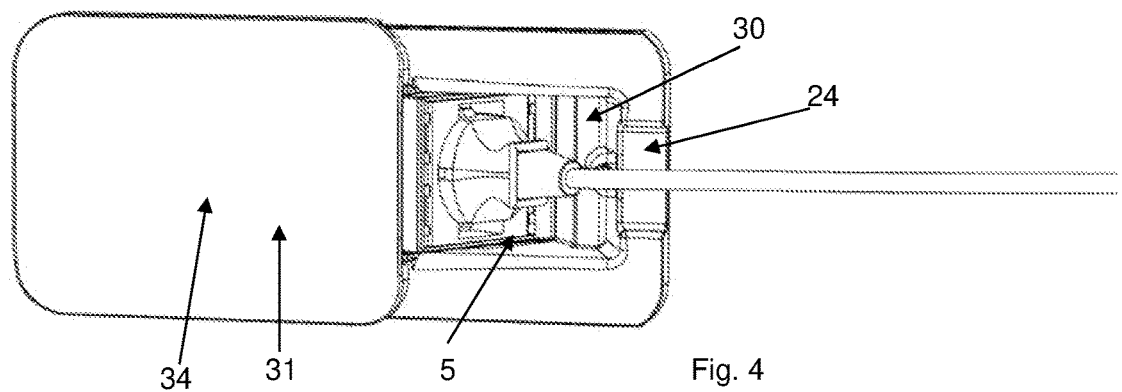
Figure 5:
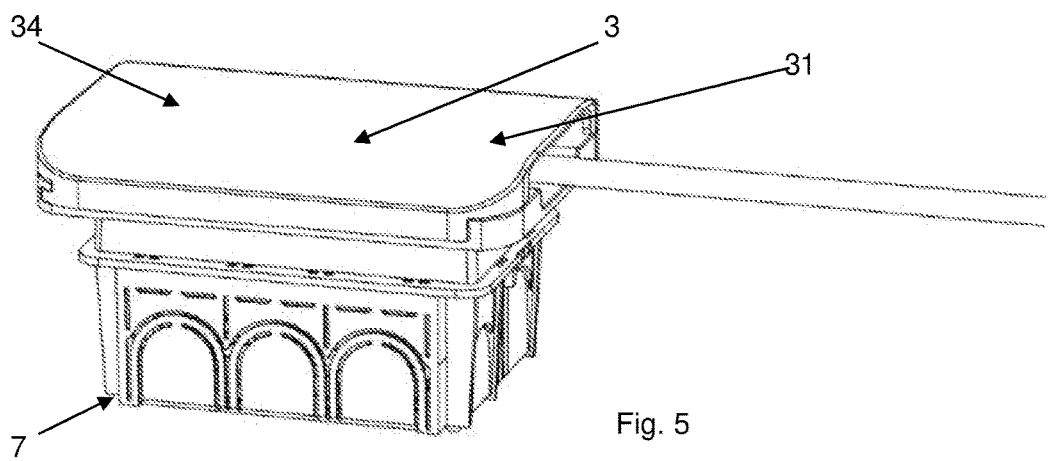
Figure 6:
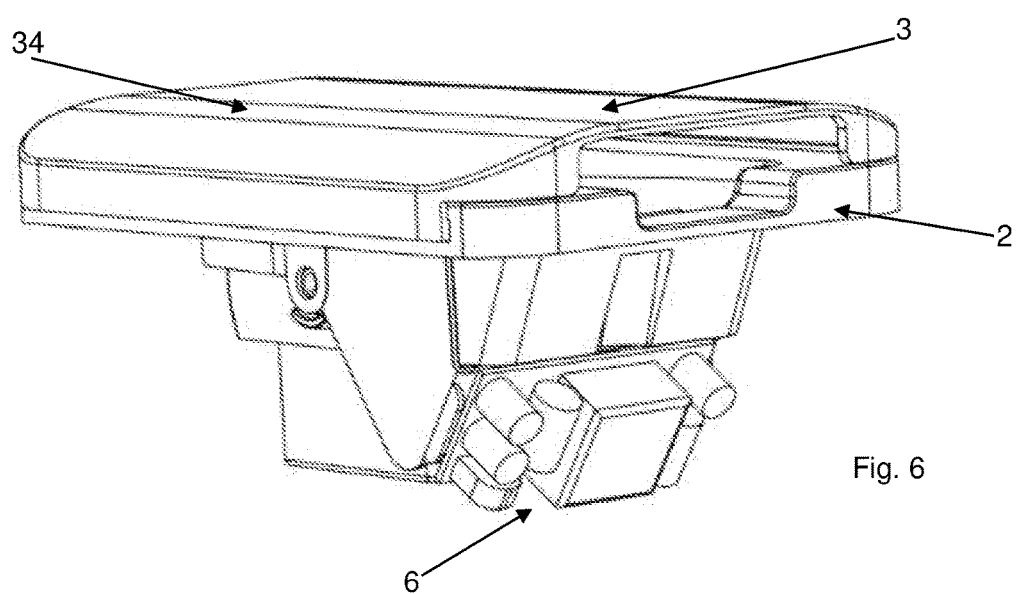
FIG. 6 shows a lateral view of an electrical user according to the present invention.
Figure 7:
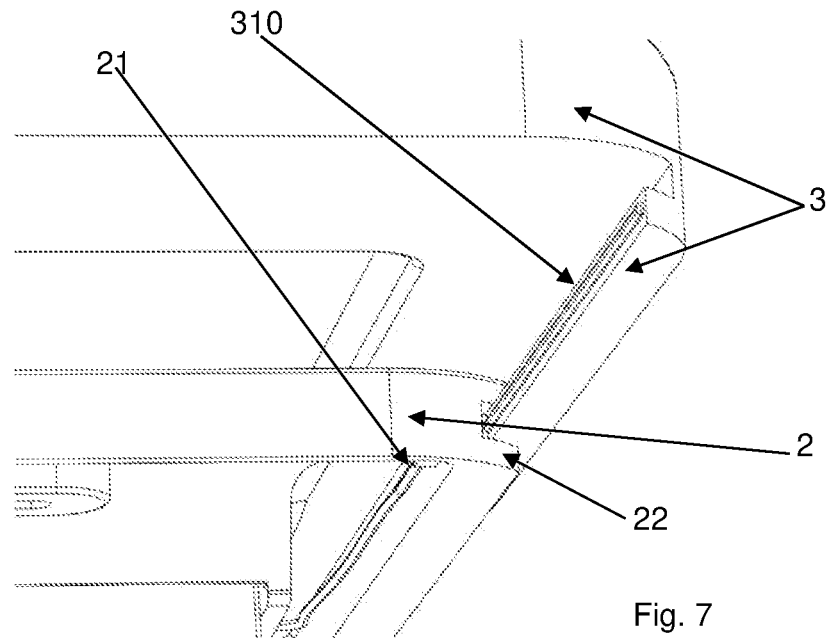
FIG. 7 shows a detailed view of a particular of an electrical user according to the present invention.

The cover 3 is movable at least between an open configuration and a closed configuration. Suitably the cover 3 in the open configuration uncovers the socket 4 (making it visible from the outside). In the closed configuration, the cover 3 typically hides the socket 4 behind. In the closed configuration a housing 30 is identified between the frame 2 (or rather the socket 4) and the cover 3; in the closed configuration the housing 30 is suitable for housing an electric plug connected to the socket 4. The plug is illustrated in FIGS. 3 and 4 inserted in the socket 4 (in these figures, the cover 3 is open to allow a view of the plug behind). Advantageously, the frame 2 can comprise a cornice 23. The cornice 23 suitably surrounds an access opening to said housing 30. The cornice 23 comprises a groove 24 adapted to allow/facilitate the passage of an electric cable (this cable is foreign to the electrical user 1, but is precisely the appliance that is connected to the socket 4). The groove 24 is important in that it allows the passage of the electric cable also in the closed configuration of the cover 3.

Advantageously, the frame 2 comprises tilting means 5 which make it possible to orient the socket 4. In particular, the tilting means 5 can assume a configuration in which the holes of the socket 4 which are suitable for the insertion of a plug lie in combination on a same plane which is substantially parallel to the cover 3 in the closed configuration (see FIG. 3; this arrangement allows the housing of German-type plugs). Furthermore, the tilting means 5 assume a configuration in which they are oriented towards the groove 24 to facilitate the exit of the electric cable of the plug that is inserted in the socket 4 (see FIG. 4; this facilitates the housing of an Italian-type plug or in any case one in which the contacts of the plug and the terminal portion of the electric cable that inserts in the plug extend along the same direction). The cover 3 comprises an electrical device 31. Electrical device 31 is intended as a device that uses electricity for its own operation. Any electronic device is therefore also intended.

Suitably the electrical user 1 comprises a transformer 6. This transformer 6 is operatively placed upstream of the electrical device 31. This transformer 6 is assembled to the frame 2 or to the box 7.

The cover 3 comprises wireless means for transmitting and/or receiving data intended to interact with other electronic equipment. Therefore, even at a distance from the frame 2, its operation is not compromised. The wireless means are essential in order to interact with other devices and for domotic control. Advantageously, the cover 3 is completely removable from the frame 2. The cover 3 is portable. Therefore, the user can remove the cover 3 and use the electrical device 3 even at a distance from the frame 2. In this regard, the cover 3 comprises an electric battery for powering said electrical device 31. It serves the function of a buffer battery. The battery ensures correct operation even when the cover 3 is completely removed from the frame 2 and therefore is not powered by an electricity mains. Such battery is appropriately of the rechargeable type. The battery is charged by exploiting the electricity mains which powers the box 7. This takes place in at least one predetermined configuration in which the cover 3 is connected to the frame 2. Preferably this occurs in any configuration in which the cover 3 is connected to the frame 2.

The electrical device 31 placed in the cover 3, at least in a configuration in which it is constrained to the frame 2, is in fact electrically powered. Suitably this is done through at least one electrical contact 21 afforded in the frame 2 (possibly through the buffer battery interposed between the electrical contact 21 and device 31). The frame 2 also comprises a guide means 22 for guiding the cover 3. The guide means 22 allow the sliding of the cover 3. Preferably, the sliding could be lateral or between the top and the bottom. Typically this sliding is translational. In the preferred solution the cover 3 is completely removable from the frame 2 at the end of a sliding stroke.

The cover 3 could comprise a strip 310 of electrically conductive material; this strip 310 is in electric communication with said contact 21 in a plurality of configurations corresponding to different degrees of opening of said cover 3.

The strip 310, in combination with at least the electrical contact 21 afforded in the frame 2, defines a sliding electrical contact for at least a portion of the sliding of the cover 3. This portion affects at least 60% of the stroke of the cover from the closed configuration to that of complete opening. This complete opening configuration is defined by a stroke end. Further extracting the cover 3 results in the removal of the cover from the frame 2. This could occur, for example deforming (at least in part in an elastic way) the end stroke (which could be for example an abutment made of plastic material).

The cover 3 is not necessarily slidable. For example, in an alternative solution the cover 3 could be a door. In this case, the cover 3 could have means for coupling and uncoupling to the frame.

Suitably the cover 3 comprises a user interface 34 of said electrical device 31. Suitably the user interface 34 is afforded on a front surface 33 of the cover 3. This user interface 34 could comprise a display, for example with touch screen controls. In FIG. 1, the front surface 33 is entirely occupied (or in any case for at least 70%) by the display.

The electrical device 31 can be of various types. For example it could comprise a domotic control device.

The device 31 could be a speaker. This is adapted to interface in a wireless mode with an acoustic input signal.

Figure 10:
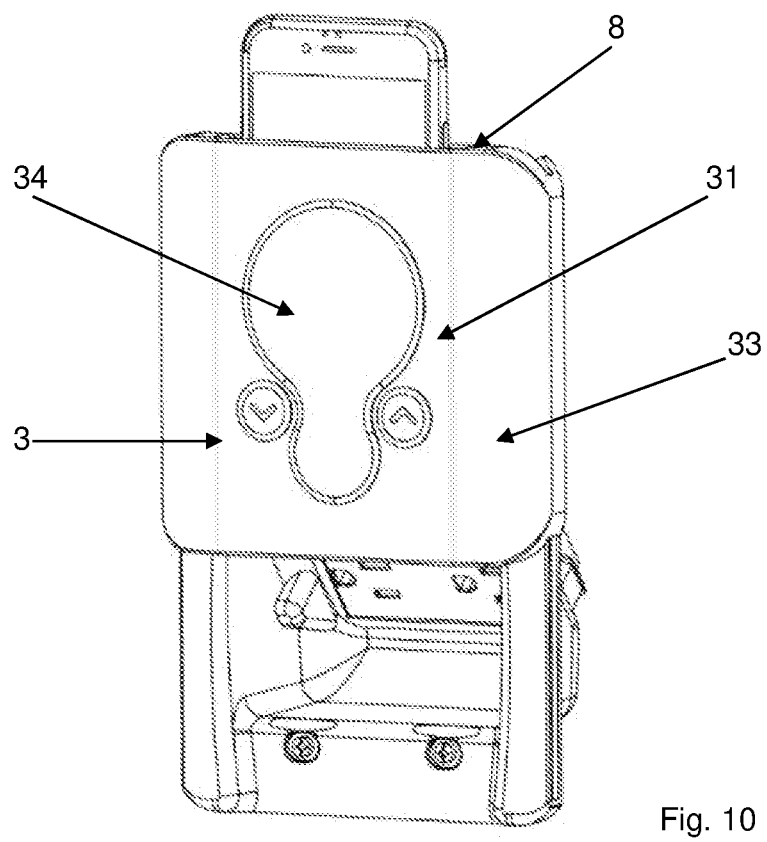
Figure 11:
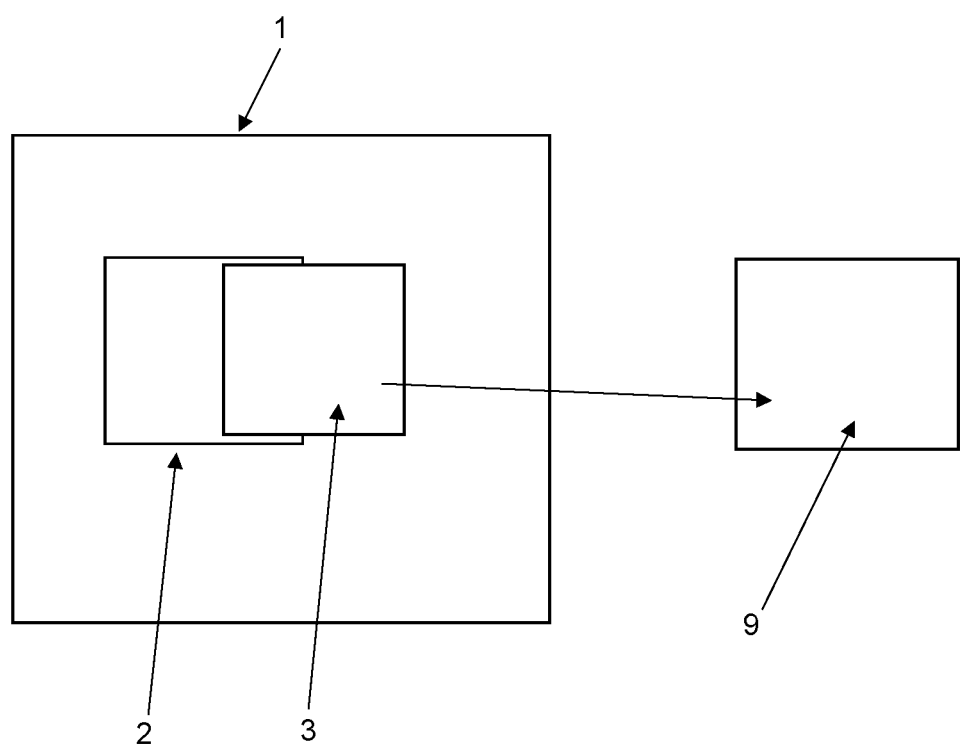
FIG. 11 discloses a system comprising an electrical user according to the present invention.

As exemplified in FIG. 10, the device 31 could be a charging device (wireless or otherwise) for phones/tablets. In this regard, the device 31 can define a pocket 8 for at least the partial insertion of the telephone/tablet for wireless charging.

As exemplified still in FIG. 10, the device 31 could be a thermostat. In this regard, the front surface has buttons and the display visible.

Figure 8:
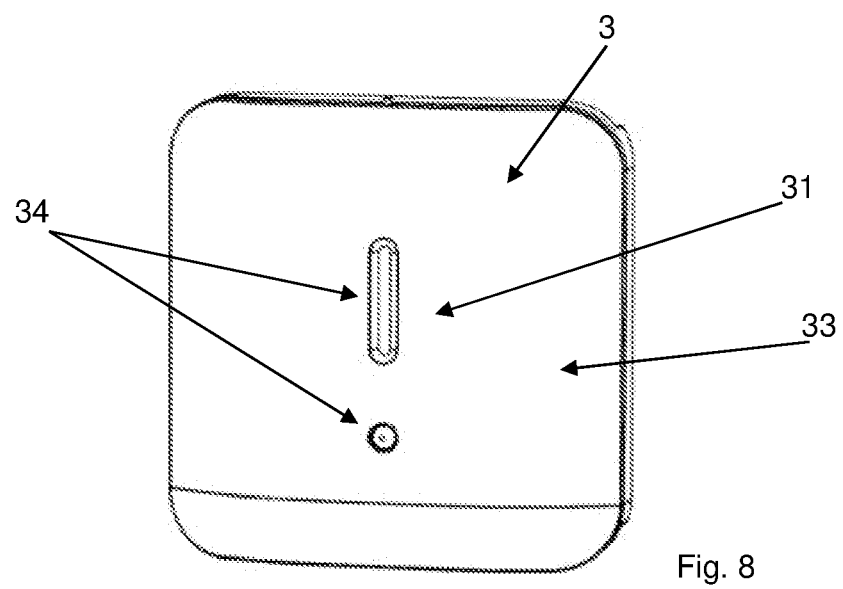
FIGS. 8, 9, 10 show perspective views of particular applications of an electrical user according to the present invention.

In this case the device 31 could comprise a temperature sensor by means of which the above-mentioned domotic control device is able to operate temperature adjustment means (for example a boiler, a heat pump, cooling systems, etc.). As exemplified in FIG. 8, the device 31 can comprise a fragrance diffuser for deodorising environments. For example, at predetermined or adjustable time intervals, the device 31 releases a fragrant jet. In an alternative solution it could release, instead of a deodorising fragrance, pesticides (for example, to counteract the presence of mosquitoes in an environment).

Figure 9:
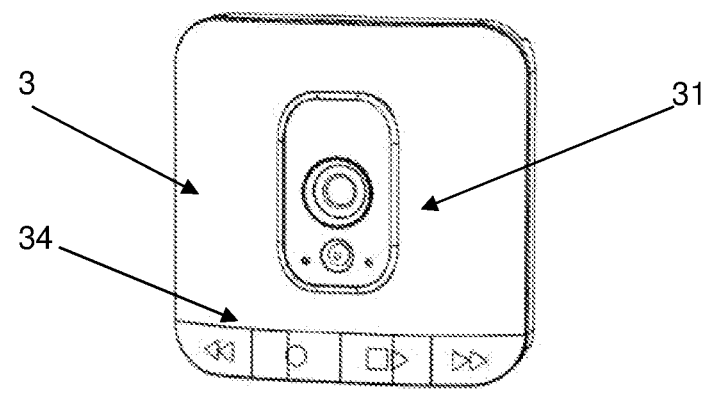

As exemplified in FIG. 9, the device 31 could also be a surveillance system. This surveillance system could be of various types. For example it could have anti-theft purposes. Such a surveillance system could however have surveillance functions to monitor an infant, an elderly person, a person who does not feel good, etc. In this regard, the monitoring system could comprise a camera and/or a microphone. The surveillance system can transmit data in a wireless mode, such as to a mobile phone. In addition or as an alternative, it could record such data in a memory.

In a further solution, the device 31 could comprise electrical current consumption detection means. Therefore this would make it possible to detect the current consumption associated with the socket 4 or with a group of electrical sockets or an entire building.

The device 31 could be an apparatus that allows telephone communications. It could be a cordless or replicate on its display one or more functions of a mobile phone or a tablet.

The object of the present invention is also a system comprising:
- an electrical user 1 having one or more of the characteristics described above;
- an additional frame 9.

The cover 3 of the electrical user 1 is applicable to the additional frame and electrically powered from the outside in a configuration in which it is applied to the additional frame. The additional frame comprises an additional electrical power/data transmission socket.

The present invention achieves important advantages.

Firstly, it makes it possible to extend the operation of the conventional hidden power sockets, enriching them with new features and optimising the arrangement of components. In particular, the cover 3 needed to hide the socket constitutes an object that can be exploited for new features. Considering it is located at an electrical socket, there are no problems housing devices that require a power supply.

In addition, the cover 3 can be removable. The user can thus carry it with him as he moves inside the building and use it as a domotic control device (to turn on lights, open blinds, turn on the heater, start the dishwasher, etc.).

In addition, within a building there are a great number of sockets distributed in various areas. Thus the cover 3 can be moved from one room to another and inserted into the frames of the concealed electrical sockets present in the various environments (in order to avoid draining the buffer battery).

The invention as it is conceived is susceptible to numerous modifications and variations, all falling within the scope of the inventive concept characterising it. Furthermore, all the details can be replaced with other technically-equivalent elements. In practice, all the materials used, as well as the dimensions, can be any according to requirements.

The invention claimed is:

1. A recessed electrical user comprising:
   a frame (2);
   a cover (3) for covering said frame (2);
   an electric power/data transmission socket (4) applied to said frame (2), the socket (4) being concealed;
   said cover (3) being movable at least between an open configuration and a closed configuration;
   in said closed configuration a housing (30) being identified between the socket (4) and the cover (3); in said closed configuration said housing (30) being suitable for housing an electric plug connected to the socket (4);

the cover (3) comprising an electrical device (31);
wherein the electrical device (31) placed in the cover (3), at least in a configuration in which it is constrained to the frame (2), is electrically powered through at least one electrical contact (21) afforded in the frame (2).

2. The user according to claim 1, characterised in that said cover (3) is completely removable from the frame (2).

3. The user according to claim 1, characterised in that the cover (3) comprises a strip (310) of electrically conductive material; said strip (310) being in electric communication with said contact (21) in a plurality of configurations corresponding to different degrees of opening of said cover (3).

4. The user according to claim 1, characterised in that said cover (3) comprises a rechargeable electric battery for powering said electrical device (31).

5. The user according to claim 1, characterised in that said cover (3) comprises a front surface (33) on which a user interface (34) of said electrical device (31) is afforded.

6. The user according to claim 1, characterised in that the cover (3) comprises a wireless data transmission and/or reception means intended to interact with other electrical/electronic apparatuses.

7. The user according to claim 1, characterised in that said electrical device (31) comprises a domotic control device or a speaker or a wireless charging device for telephones/tablets or a fragrance/pesticide diffuser or a thermostat or a surveillance system or an electrical current consumption detection means.

8. A system comprising:
an electrical user (1) according to claim 1;
an additional frame (9);
the cover (3) of the electrical user (1) being applicable to the additional frame (9) and electrically powered from the outside in a configuration in which it is applied to the additional frame (9).

9. The user according to claim 1, characterised in that the frame (2) comprises a guide means (22) for guiding the cover (3), said guide means (22) allowing a sliding of the cover (3) to pass from the closed configuration to the open configuration and vice versa.

10. The user according to claim 9, characterised in that the guide means (22) allow the lateral sliding of the cover (3).

11. The user according to claim 9, characterised in that the sliding is translational.

* * * * *